US008632691B2

(12) United States Patent
Huang et al.

(10) Patent No.: US 8,632,691 B2
(45) Date of Patent: Jan. 21, 2014

(54) INTERFACE TREATMENT METHOD FOR GERMANIUM-BASED DEVICE

(75) Inventors: Ru Huang, Beijing (CN); Min Li, Beijing (CN); Xia An, Beijing (CN); Ming Li, Beijing (CN); Meng Lin, Beijing (CN); Xing Zhang, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 13/702,562

(22) PCT Filed: Jun. 14, 2012

(86) PCT No.: PCT/CN2012/076877
§ 371 (c)(1),
(2), (4) Date: Dec. 6, 2012

(65) Prior Publication Data
US 2013/0309875 A1 Nov. 21, 2013

(30) Foreign Application Priority Data
May 18, 2012 (CN) .......................... 2012 1 0156456

(51) Int. Cl.
B44C 1/22 (2006.01)
C03C 15/00 (2006.01)
C03C 25/68 (2006.01)
C23F 1/00 (2006.01)
C25F 3/00 (2006.01)

(52) U.S. Cl.
USPC ...................... 216/96; 216/83; 216/99; 134/3

(58) Field of Classification Search
USPC .......................................... 216/83, 96; 134/3
See application file for complete search history.

(56) References Cited

U.S. PATENT DOCUMENTS

| 7,132,372 B2 * | 11/2006 | Smith et al. ................... 438/767 |
| 7,641,738 B2 * | 1/2010 | Abbadie et al. ................... 134/2 |
| 2006/0024970 A1 | 2/2006 | Smith et al. |
| 2012/0091100 A1 | 4/2012 | Bedell et al. |

FOREIGN PATENT DOCUMENTS

| CN | 102206799 A | 10/2011 |
| CN | 102381718 A | 3/2012 |

OTHER PUBLICATIONS

International Search Report and Written Opinion (ISA/CN) for International Application No. PCT/CN2012/076877, mailed Mar. 7, 2013.

* cited by examiner

Primary Examiner — Roberts Culbert
(74) Attorney, Agent, or Firm — Foley & Lardner LLP; Antoinette F. Konski; Angela D. Murch

(57) ABSTRACT

Disclosed herein is an interface treatment method for germanium-based device, which belongs to the field of manufacturing technologies of ultra large scaled integrated (ULSI) circuits. In the method, the natural oxide layer on the surface of the germanium-based substrate is removed by using a concentrated hydrochloric acid solution having a mass percentage concentration of 15%~36%, and dangling bonds of the surface are performed a passivation treatment by using a diluted hydrochloric acid solution having a mass percentage concentration of 5%~10% so as to form a stable passivation layer on the surface. This method makes a good foundation for depositing a high-K (high dielectric constant) gate dielectric on the surface of the germanium-based substrate after cleaning and passivating, enhances quality of the interface between the gate dielectric and the substrate, and improves the electrical performance of germanium-based MOS device.

5 Claims, 3 Drawing Sheets

INTERFACE TREATMENT METHOD FOR GERMANIUM-BASED DEVICE

CROSS-REFERENCE TO RELATED APPLICATION

The present application is a national stage application under 35 U.S.C. §371 of International Application No. PCT/CN2012/076877, filed Jun. 14, 2012, which in turn claims priority to Chinese Patent Application No. 201210156456.8, filed May 18, 2012, the contents of each of which are incorporated herein by reference in their entireties its entirety as if set forth herein.

FIELD OF THE INVENTION

The present invention refers to manufacturing technologies of ultra large scaled integrated (ULSI) circuits, and more particularly, refers to an interface treatment method for a germanium-based device.

BACKGROUND OF THE INVENTION

As feature sizes have been constantly shrinked, conventional silicon-based MOS devices have been confronted with numerous challenges and limitations, such as mobility degradation. DIBL, hot carrier effects, and NBTI. Among them, the problem of mobility degradation may affect improvement for operating speed of the integrated circuit. Hence, it is in urgent need of seeking a new material or a new device to overcome this problem. Since germanium has a larger electron and hole mobility than that of silicon and a lower impurity activation temperature, and the fabrication process of a germanium channel device is compatible with a conventional CMOS process, germanium has obtained extensive attentions. Currently, however, the fabrication technology of the germanium-based MOS device has not been matured yet, and the performance of the device is not quite stable. One of reasons limiting development of the germanium-based MOS device is that an interface characteristic between gate dielectric and substrate of the germanium-based MOS device is not quite satisfactory. Therefore, it is an important process step to remove a natural oxide layer on the surface of germanium-based substrate and passivate the surface of the germanium-based substrate so as to alleviate the natural oxidation once more.

SUMMARY OF THE INVENTION

In order to solve the above-mentioned problems, an interface treatment method suitable for germanium-based device is proposed in the present invention. By the method, the natural oxide layer on the surface of germanium-based substrate is removed effectively, and a passivation layer is formed on the surface after cleaning to alleviate occurrence of natural oxidation once more, thus improving the quality of an interface between gate dielectric and the germanium-based substrate, as well as performance of the germanium-based MOS device.

An interface treatment method for germanium-based device according to the present invention includes the following steps:

1) cleaning a semiconductor germanium-based substrate;

2) soaking the germanium-based substrate in a concentrated hydrochloric acid solution having a mass percentage concentration of 15%~36%, and then repeatedly rinsing the germanium-based substrate with deionized water so as to remove the natural oxide layer on the surface of the germanium-based substrate;

3) soaking the germanium-based substrate in a diluted hydrochloric acid solution having a mass percentage concentration of 5%~10%, and then repeatedly rinsing the germanium-based substrate with deionized water to form a stable Ge—Cl passivation layer on the surface of the germanium-based substrate so that a passivation treatment on the surface of the germanium-based substrate is performed.

In step 1), the germanium-based substrate may be a bulk germanium substrate, an epitaxial germanium substrate, or a germanium-on-insulator (GOI) substrate.

In step 1), the cleaning of the germanium-based substrate is aimed to remove organic and inorganic contaminants, metal particles and other source pollutions that is on the surface of the germanium-based substrate, wherein the germanium-based substrate is firstly cleaned by an organic solvent and then boiled in the hydrochloric acid.

As compared with the prior art, the present invention has the following beneficial effects.

First of all, during the cleaning with hydrochloric acid for boiling the germanium-based substrate and during the rinsing, a germanium dioxide in the natural oxide layer is removed effectively, but germanium suboxide such as germanium monoxide in the natural oxide layer is insoluble in water or diluted hydrochloric acid. Remained germanium suboxide such as germanium monoxide can be removed effectively by using a concentrated hydrochloric acid solution having a mass percentage concentration of 15%~36% according to the present invention, so that a smooth and uniform surface can be obtained. Secondly, after removing the natural oxide layer, since a natural oxidation may occur once more on the surface of the germanium-based substrate exposed in the atmospheric environment, and the existence of a natural oxide layer would affect quality of the gate dielectric. The oxidation happened once more due to the surface of the germanium-based substrate being exposed to the atmospheric environment can be alleviated by passivating dangling bonds of the surface through a diluted hydrochloric acid solution having a mass percentage concentration of 5%~10% to form a stable Ge—Cl passivation layer on the surface. This process effectively alleviates the occurrence of nature oxidation of the surface of the germanium-based substrate in atmospheric environment once more and makes a good foundation for depositing a high-K (high dielectric constant) gate dielectric on the surface of the germanium-based substrate after being cleaned and passivated. Thus, the quality of an interface between the gate dielectric and the substrate is improved, and the electrical performance of the germanium-based MOS device is improved. Finally, in the method, the interface treatment on the surface of the germanium-based device is performed without increasing process complexity, which is advantageous for subsequent process integration.

DETAILED DESCRIPTION OF THE EMBODIMENTS

A flow of a method according to the present invention is further described through detailed embodiments with reference to accompany drawings.

Figure 1:
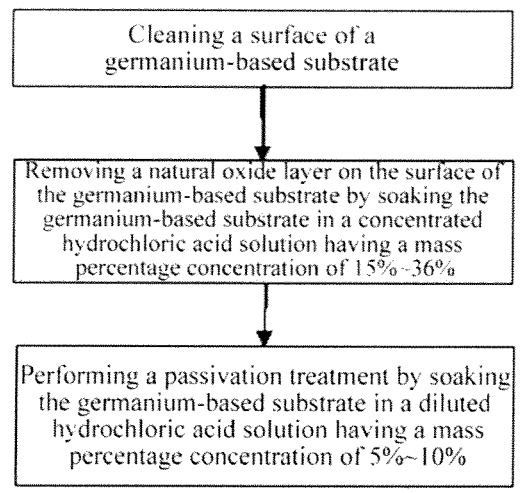
FIG. 1 is a flow chart of an interface treatment method for germanium-based device according to an embodiment.

FIG. 1 is a flow chart of an interface treatment method for a germanium-based device according to an embodiment.

Step 1: A germanium-based substrate is provided. The germanium-based substrate may be a bulk germanium substrate, an epitaxial germanium substrate, a germanium-on-insulator (GOI) substrate or the like.

Step 2: The germanium-based substrate is cleaned. Firstly, the substrate is cleaned by organic solvents, in which the substrate is cleaned alternatively by acetone and ethanol twice, and is rinsed repeatedly with deionized water so as to remove grease dirties and organic contaminants on the substrate. Next, the germanium-based substrate is cleaned and boiled in hydrochloric acid in which the germanium-based substrate is boiled in a diluted hydrochloric acid, and then is rinsed repeatedly with deionized water so as to remove inorganic contaminants, metal particles and so on. A purpose of the cleaning is to remove the organic and the inorganic contaminants, metal particles etc. on the substrate. However, the present invention is not limited to the cleaning methods set forth above.

Step 3: The natural oxide layer on the surface is removed. The germanium-based substrate is soaked in a concentrated hydrochloric acid solution having a mass percentage concentration of 15%~36% for 10~30 seconds, and then is moved quickly into deionized water to be rinsed circularly for 15 times. Next, the surface is dried by a nitrogen gas gun. In an example, a concentrated hydrochloric acid solution having a mass percentage concentration of 36% is used for soaking the germanium-based substrate 10 seconds.

Step 4: The surface is passivated. The germanium-based substrate is soaked in a diluted hydrochloric acid solution having a mass percentage concentration of 5%~10% for 5 min~30 min, and then is rinsed repeatedly with deionized water. Next, the surface is dried gently by a nitrogen gas gun, so that a passivation treatment for dangling bonds of the surface of the germanium-based substrate is completed. In an example, the diluted hydrochloric acid solution having a mass percentage concentration of 10% is used for soaking the germanium-based substrate for 10 minutes.

Figure 2A:
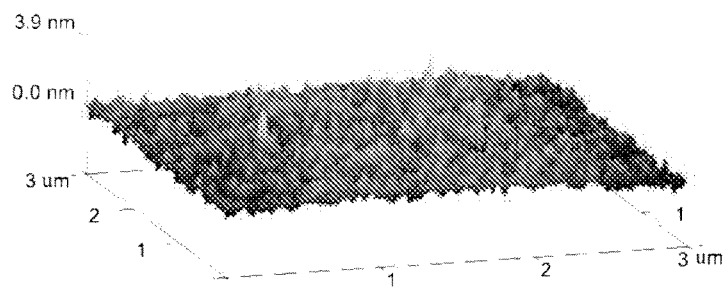
FIGS. 2(a) and 2(b) are appearance photographs obtained by atomic force microscope (AFM) of the surface of the germanium-based substrate after using two methods for removing the natural oxide layer, respectively.
Figure 2B:
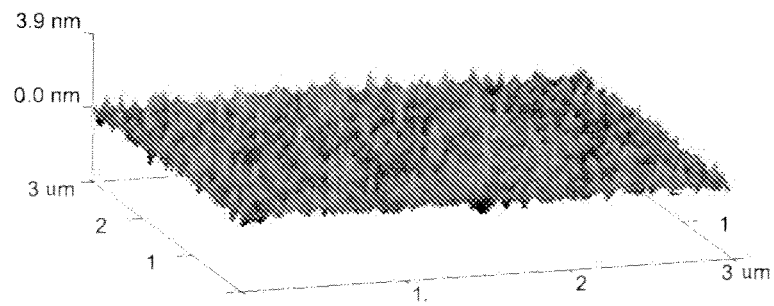

FIG. 2 shows appearance photographs obtained by atomic force microscope (AFM) of the surface of the germanium-based substrate after using two methods for removing the natural oxide layer. In FIG. 2($a$), a solution obtained by mixing hydrofluoric acid and water with a volume ratio of 1:20 is used to clean and remove the natural oxide layer. In FIG. 2($b$), a concentrated hydrochloric acid solution having a mass percentage concentration of 36% is used to clean and remove the natural oxide layer. For the two graphs obtained by AFM, the scanning area is 3×3 $\mu m^2$, where the root-mean-square (Rms) roughness of the surface after cleaning by the diluted hydrofluoric acid solution is 0.307 nm, and the root-mean-square (Rms) roughness of the surface after cleaning by the concentrated hydrochloric acid solution having a mass percentage concentration of 36% according to the invention is 0.281 nm. It can be seen that the surface cleaned by the concentrated hydrochloric acid solution having a mass percentage concentration of 36% according to an embodiment of the invention is smoother and more uniform, has a lower root-mean-square roughness, and has a larger improvement in terms of scattering and leakage due to the interface roughness. It is mainly because that the germanium suboxide such as germanium monoxide in the natural oxide layer can be effectively removed by the concentrated hydrochloric acid solution, so that the natural oxide layer can be substantially removed.

Figure 3:
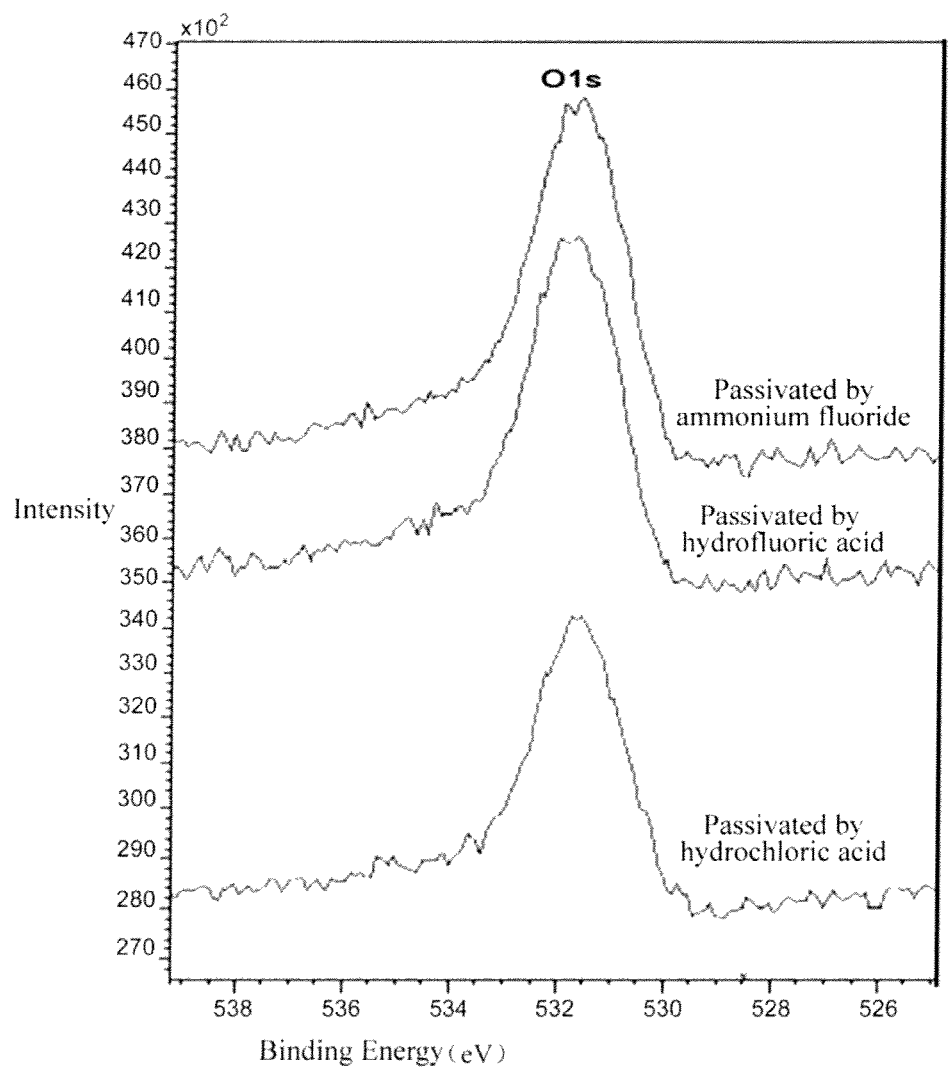
FIG. 3 is an O 1s photoelectron spectroscopy of the surface of the germanium-based substrate after using three passivation methods.

FIG. 3 shows an O 1s photoelectron spectroscopy of x-ray photoelectron spectroscopy (XPS) component analysis of the surface of the germanium-based substrate after using three passivation methods. A hydrofluoric acid solution having a mass percentage concentration of 10%, an ammonium fluoride solution having a mass percentage concentration of 40%, and the diluted hydrochloric acid solution having a mass percentage concentration of 10% according to the invention are used, respectively. A peak intensity of O 1s for each of the above-mentioned samples, which are all subjected to the passivation treatment for 10 minutes and then are placed in the atmospheric environment for 120 hours, is each detected by XPS. In FIG. 3 by comparing the relative intensity of each of the three O 1s peak values, an oxygen content of the surface of the germanium-based substrate passivated according to the embodiment of the invention is minimum.

Figure 4:
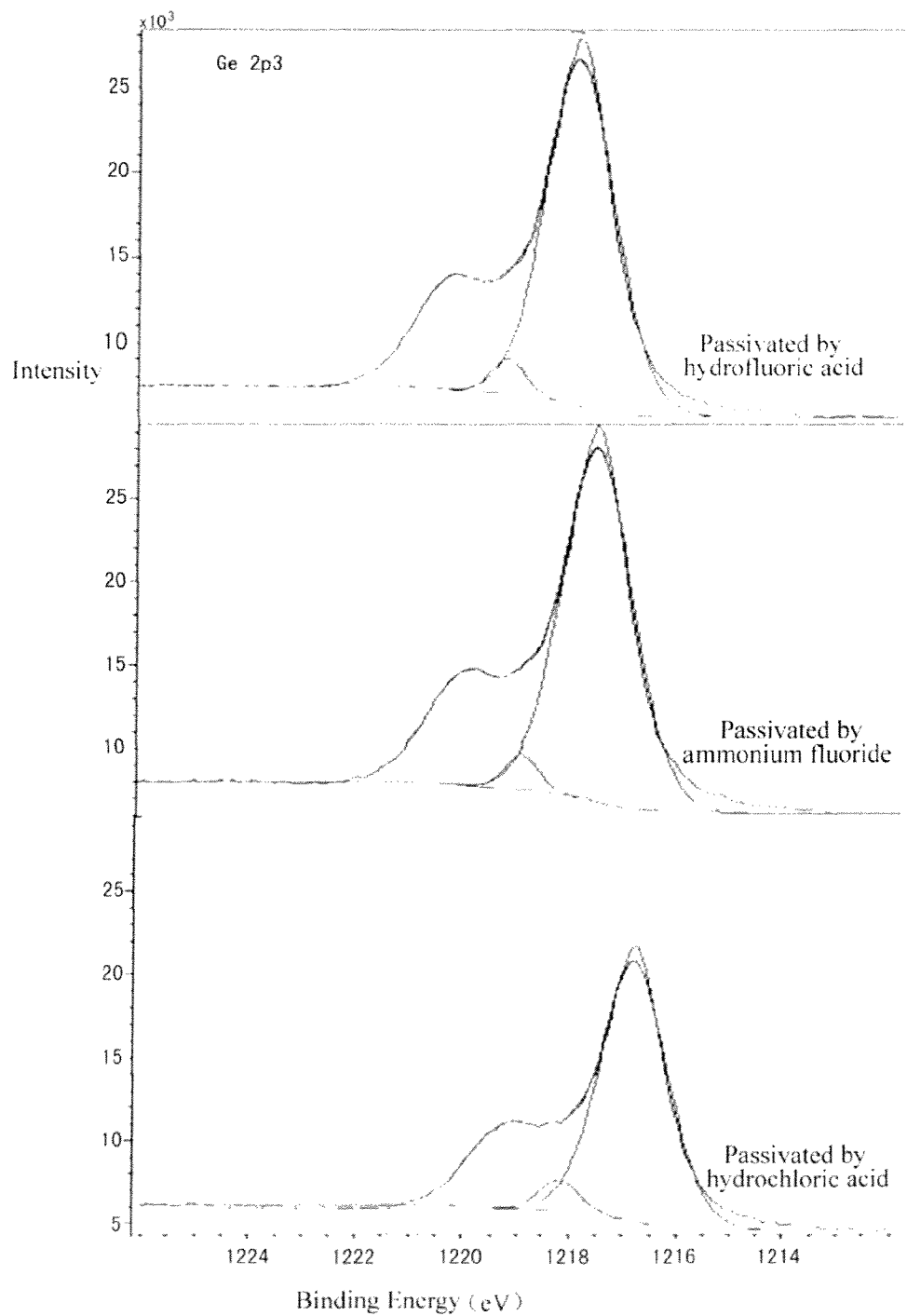
FIG. 4 is a Ge 2p3 photoelectron spectroscopy of the surface of the germanium-based substrate after using the three passivation methods.

FIG. 4 shows a Ge 2p3 photoelectron spectroscopy after using the three passivation methods. A peak value adjacent to a binding energy of 1219 eV corresponds to $GeO_x$. By means of fitting the area of $GeO_x$ in the Ge 2p3 photoelectron spectroscopy, it can be obtained that the content of $GeO_x$ passivated by a hydrofluoric acid solution having a mass percentage concentration of 10% is 26.12%; the content of $GeO_x$ passivated by an ammonium fluoride solution having a mass percentage concentration of 40% is 26.08%; and the content of $GeO_x$ passivated by a diluted hydrochloric acid solution having a mass percentage concentration of 10% according to the invention is 24.88%. This shows that the passivation layer formed by the passivation treatment method according to the invention is more effective, has lowest oxygen content after being placed in the atmospheric environment for 120 hours, and has better interface stabilities.

The interface treatment method for the germanium-based device proposed by the present invention has been described and illustrated in detail with reference to the above-mentioned preferable embodiments. However, it should be understand by those skilled in the art that, the above-mentioned embodiments are only preferable embodiments of the invention, the fabrication methods and applications of the present invention should not be limited to the contents disclosed in the embodiment without departing from the scope of the present invention. Rather, any equivalent variations and modifications according to claims of the present invention all fall within the scope of the present invention.

What is claimed is:

1. An interface treatment method for a germanium-based device, comprising:
    1) cleaning a germanium-based substrate;
    2) removing a natural oxide layer on a surface of the germanium-based substrate by using a concentrated hydrochloric acid solution having a mass percentage concentration of 15%-36%; and
    3) performing a passivation treatment for the surface of the germanium-based substrate by using a diluted hydrochloric acid solution having a mass percentage concentration of 5%-10%.

2. The method according to claim 1, wherein, the germanium-based substrate is a bulk germanium substrate, an epitaxial germanium substrate, or a germanium-on-insulator substrate.

3. The method according to claim 1, wherein, in step 1), the germanium-based substrate is firstly cleaned by an organic solvent, and is then boiled in a hydrochloric acid to be cleaned.

4. The method according to claim 1, wherein, in step 2), the germanium-based substrate is soaked in the concentrated hydrochloric acid solution for 10-30 seconds and then is moved into deionized water to be rinsed circularly for 15-20 times, and then the surface of the germanium-based substrate is dried.

5. The method according to claim 1, wherein, in step 3), the germanium-based substrate is soaked in the diluted hydrochloric acid solution for 5 minutes-30 minutes and then is moved into deionized water to be rinsed circularly for 10-15 times, and then the surface of the germanium-based substrate is dried.

* * * * *